(12) United States Patent
Maheshwari (10) Patent No.: US 7,298,635 B1
(45) Date of Patent: Nov. 20, 2007

(54) CONTENT ADDRESSABLE MEMORY (CAM) CELL WITH SINGLE ENDED WRITE MULTIPLEXING

(75) Inventor: Dinesh Maheshwari, Fremont, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 11/376,764

(22) Filed: Mar. 15, 2006

Related U.S. Application Data (60) Provisional application No. 60/661,745, filed on Mar. 15, 2005.

(51) Int. Cl.
*G11C 15/00* (2006.01)
(52) U.S. Cl. .................... 365/49; 365/189.07; 365/205
(58) Field of Classification Search .................. 365/49, 365/189.07, 205
See application file for complete search history.

(56) References Cited

U.S. PATENT DOCUMENTS

| | | | |
|---|---|---|---|
| 4,523,301 A | 6/1985 | Kadota et al. | |
| 4,646,271 A | 2/1987 | Uchiyama et al. | |
| 4,845,668 A | 7/1989 | Sano et al. | |
| 5,339,268 A | 8/1994 | Machida | |
| 6,108,227 A | 8/2000 | Voelkel | |
| 6,266,262 B1 | 7/2001 | Washburn et al. | |
| 6,505,270 B1 | 1/2003 | Voelkel et al. | |
| 6,564,289 B2 | 5/2003 | Srinivasan et al. | |
| 7,019,999 B1 * | 3/2006 | Srinivasan et al. | 365/49 |
| 7,084,672 B1 * | 8/2006 | Meng et al. | 327/51 |
| 7,173,837 B1 * | 2/2007 | Bettman et al. | 365/49 |

* cited by examiner

*Primary Examiner*—Hoai V. Ho
(74) *Attorney, Agent, or Firm*—Haverstock & Owens LLP (57) ABSTRACT

A content addressable memory (CAM) cell circuit can include a match section that enables an impedance path coupled to a match line in response to a comparison between a data value and a compare data value. At least a first storage circuit can be connected to the match section, and provides the data value on a first storage node and a complementary data value on a second storage node. At least a first bit line can be coupled to the first storage node by a first access controllable impedance path and coupled to the second storage node by a second access controllable impedance path.

20 Claims, 8 Drawing Sheets

CONTENT ADDRESSABLE MEMORY (CAM) CELL WITH SINGLE ENDED WRITE MULTIPLEXING

This application claims the benefit of U.S. Provisional Patent Application Ser. No. 60/661,745, filed Mar. 15, 2005, the contents of which are incorporated by reference herein.

TECHNICAL FIELD

The present invention relates generally to memory devices, and more particularly to content addressable memory (CAM) cells.

BACKGROUND OF THE INVENTION

Conventional content addressable memories (CAMs) can provide rapid matching between a specific pattern of received data bits, commonly known as a search key or comparand, and data values stored in a content addressable memory (CAM) array. In a CAM device, a CAM array can be searched in parallel. If a match occurs between each bit of a stored data value and a corresponding bit of an applied comparand, a match indication can be generated, via a match line, to indicate that the applied comparand is stored in the CAM. Data associated with the matching CAM location can then be returned. Thus, in a CAM device, a result can be determined from finding a matching value (content), and not from an address for a value, as is typically done for a random access memory (RAM).

Conventional CAMs are typically composed of a number of CAM cells that can be arranged into an array. Conventional CAM cells can include binary CAM cells as well as ternary CAM cells.

A conventional binary CAM cell can store a data bit value (i.e., logic "0" or logic "1"). When such a stored data bit value matches an applied compare data bit value, the binary CAM cell can maintain a high impedance between a precharged match line and a lower discharge potential. If all binary CAM cells connected to a given match line provide a match result, the match line can maintain the precharged state, indicating a match result. When a stored data bit value does not match an applied compare data bit value, the binary CAM cell can provide a low impedance between a precharged match line and lower discharge potential. Thus, if any one of the binary CAM cells connected to a given match line provides a no match result, the match line will be discharged, indicating a no match (miss) result for the comparand.

A conventional ternary (TCAM) cell can store three states, including a logic "0", logic "1" and a "don't care". When such a TCAM cell stores a logic "0" or logic "1", the TCAM cell can provide the same essential match operation as a binary CAM cell. However, when such a TCAM cell stores a "don't care" value, the TCAM cell can provide a match result regardless of the compare data value applied to the TCAM cell.

Figure 9:
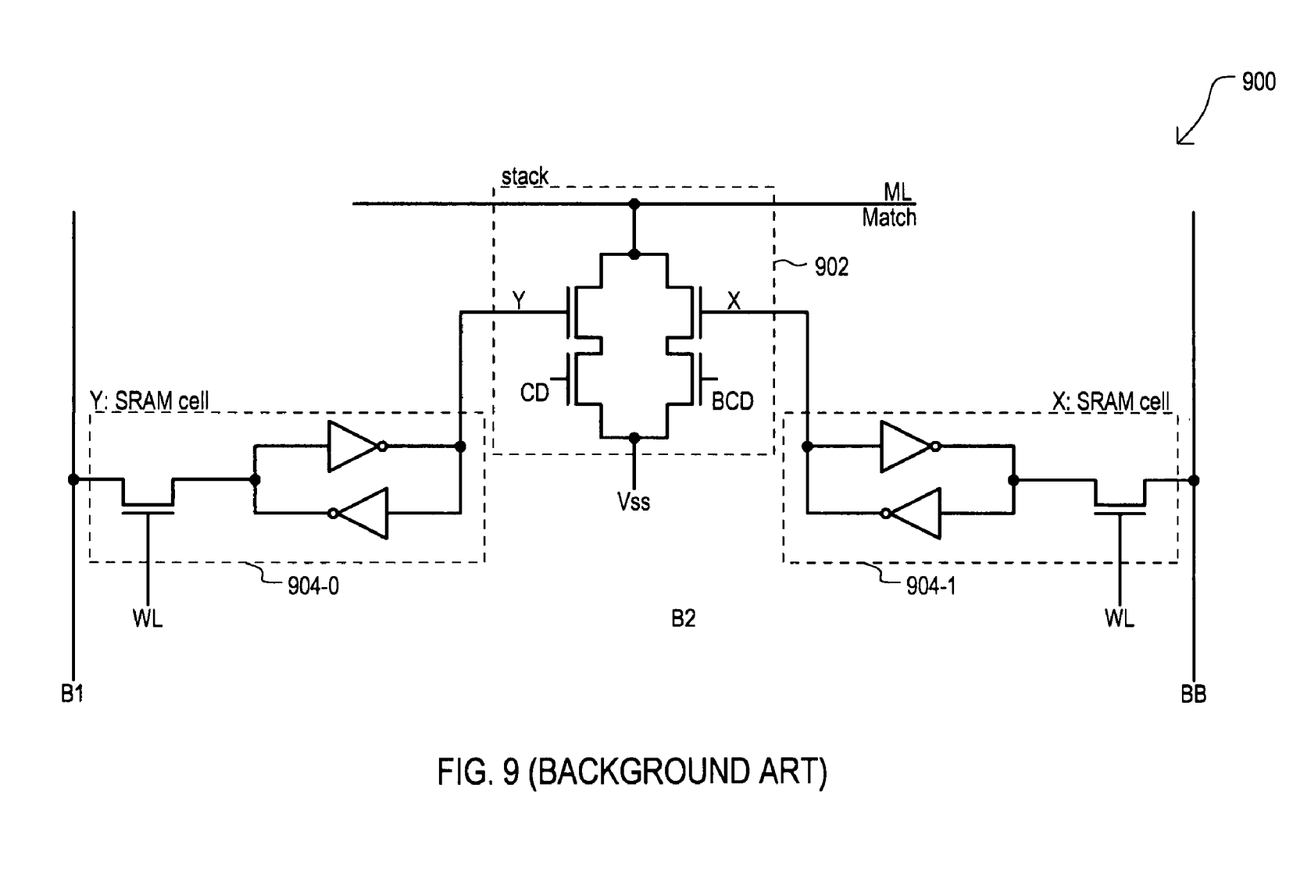
FIG. 9 is a schematic diagram of a conventional ternary CAM cell.

A schematic diagram of a conventional "X/Y" type TCAM cell is shown in FIG. 9. Referring to FIG. 9, a conventional TCAM cell 900 can generally include a "stack" 902 and two static random access memory (SRAM) cells 904-0 and 9041. In the particular arrangement of FIG. 9, SRAM cells (904-0 and 904-1) can store data bits (referred to typically as an X-value and Y-value) to be compared by transistors within stack 902 against externally supplied comparand data provided at inputs CD and BCD. An input CD can provide a compare data value, while input BCD can provide a complementary compare data value (compare data "bar"). That is CD and BCD are complementary values with respect to each other. The stack 902 of FIG. 9 includes four N-type metal-oxide-semiconductor (MOS) transistors.

As noted above, FIG. 9 shows an "X/Y" type TCAM cell. In such an arrangement, a masking value (don't care) is determined according to a data value stored in both SRAM cells (904-0 and 9041). This is in contrast to a "V/M" type TCAM cell in which a masking value is determined according to one data value (e.g., M) stored in a single SRAM cell.

Conventional TCAM cells like that of FIG. 9 and CAM devices employing such CAM cells, can have limitations, however. In particular, in many cases write operations to SRAM cells within a same TCAM cell are not separable. That is, data may not be written to one SRAM cell without accessing the other in the same operation. One way of referring to this limitation is to call write operations "atomic" (i.e., not being capable of being split between storage elements). It follows that a "non-atomic" write operation would be capable of writing data to just one SRAM cell of a CAM cell, if possible.

In addition, conventional approaches typically require write operations to occur on a row-by-row basis. That is, it is typically not possible to write data in a column wise fashion in a CAM array to multiple rows. One way of referring to this limitation is to note that conventional write operations are not column wise bit-maskable.

Figure 10:
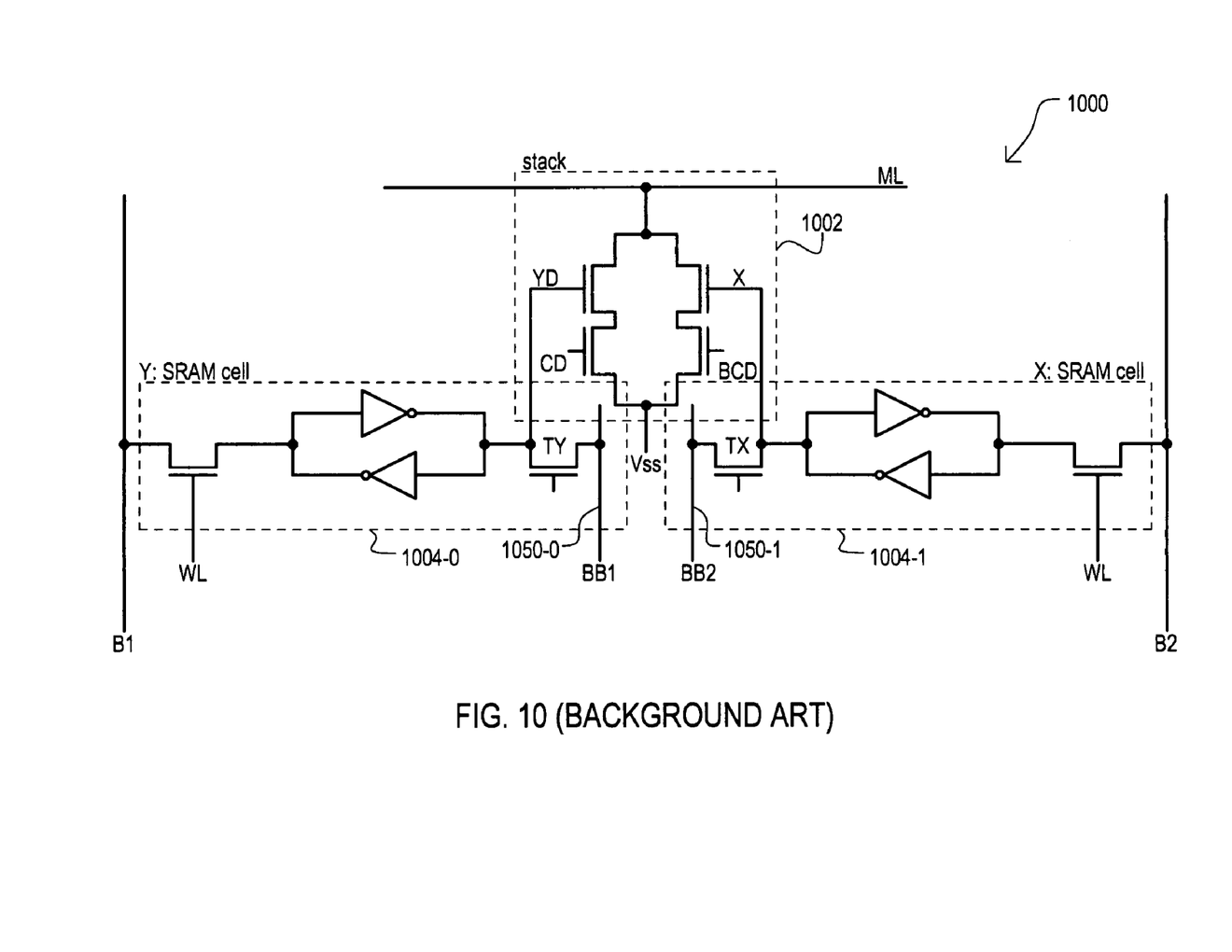
FIG. 10 is a schematic diagram of a second conventional ternary CAM cell.

A second conventional TCAM cell is shown in FIG. 10, and designated by the general reference character 1000. The arrangement of FIG. 10 can include some of the same structures as that of FIG. 9. However, CAM cell 1000 can include additional bit lines BB1/BB2 (1050-0 and 1050-1) that can enable both bit-maskable and non-atomic write operations. In particular, complementary write data can be driven on bit line pairs B1/BB1 and/or B2/BB2 to write data to either SRAM cell (1004-0 or 1004-1).

However the inclusion of such bit lines can result in a significantly larger CAM cell size. Potentially, a size of CAM cell 1000 can be as much as 50% greater than that of FIG. 9.

DETAILED DESCRIPTION

The following embodiments are directed to content addressable memories (CAMs), and more particularly to CAM cell circuits that can allow for column wise bit-maskable and non-atomic write operations.

In the following descriptions, for purposes of explanation, numerous specific details are set forth in order to provide a thorough understanding of the present invention. It will be evident, however, that one skilled in the art that the present invention may be practiced without these specific details. In other instances, well-known circuits, structures and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Briefly, a CAM cell of the embodiments can include one or more storage circuits that store one or more data values and a match stack (or compare section) that can provide a charge transfer path between a match line and a discharge node in response to a comparison between the stored data value(s) and a compare data value. A storage circuit of the CAM cell can be connected to a single bit line via two different access paths, each being controlled by a different signal.

The various embodiments can allow for writes to CAM cells that are bit-maskable and/or non-atomic. Further, writes can be accomplished in a multiplexed fashion as will be described below in more detail. For purposes of clarity, many of the details of CAM cell architecture and operation that are widely known and are not relevant to the present invention have been omitted from the following description.

Figure 1:
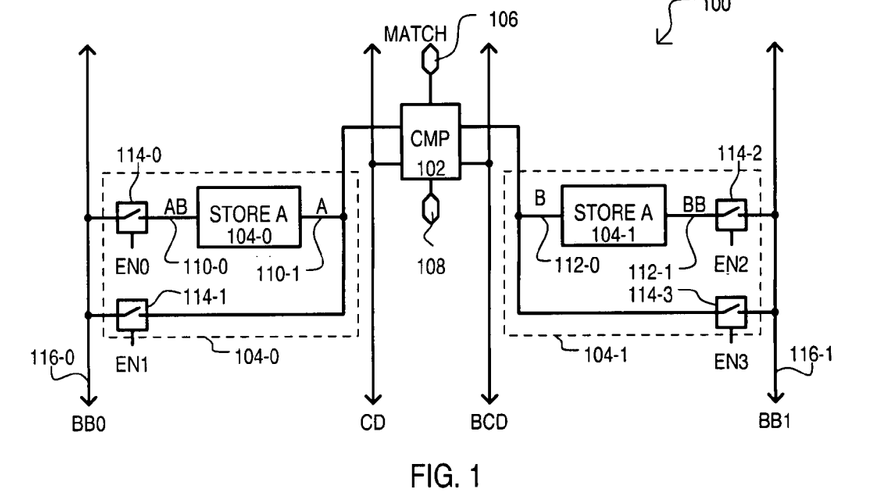
FIG. 1 is a block schematic diagram of a content addressable memory (CAM) cell according to a first embodiment.

A CAM cell according to a first embodiment is set forth in FIG. 1, and designated by the general reference character 100. A CAM cell 100 can include a stack (or compare) section 102, a first storage cell 104-0, and a second storage cell 104-1. A stack section 102 can provide an impedance path between a match node 106 and a reference node 108. Prior to the application of compare data, a potential difference can be established between match node 106 and reference node 108. In response to the application of compare data, compare section 102 can provide either a high or low impedance path. A match result (e.g., either HIT or MISS) can be generated in response to charge transferring between match node 106 and reference node 108.

A first storage cell 104-0 and a second storage cell 104-1 can store data bit values for comparison to one or more applied comparand values in a compare operation. Each storage cell (104-0 and 1041) stores a data value (A or B) and its corresponding complement (AB or BB). Storage cell 104-0 can include a first node 110-0 that stores a data value AB and a second node 110-1 that stores a data value A. Similarly, storage cell 104-1 can include a third node 112-0 that stores a data value B and a fourth node 112-1 that stores a data value BB.

Each storage cell (104-0 and 104-1) can be connected to a corresponding bit line by two switch paths. In the particular example shown, storage cell 104-0 can have node 110-0 connected to bit line 116-0 by a first switch path 114-0 and a node 110-1 connected to the same bit line 116-0 by a second switch path 114-1. Storage cell 104-1 can have node 112-1 connected to bit line 116-1 by a third switch path 114-2 and a node 112-0 connected to the same bit line 116-1 by a fourth switch path 114-3. Each switch path (114-0 to 114-3) can be enabled by a corresponding signal EN0 to EN3.

Referring still to FIG. 1, write operations to each storage cell (104-0 and 104-1) can include driving a first node to one logic value via a bit line, and then driving the other node to the opposite logic value via the same bit line. In this way, write operations can involve the multiplexed application of complementary write data. In the particular example shown, to write to storage cell 104-0, bit line 116-0 can be driven to a first logic value and first switch path 114-0 enabled (low impedance). First switch path 114-0 can then be disabled (high impedance). Bit line 116-0 can then be driven to a second logic value and second switch path 114-1 can be enabled.

It is understood that absent a multiplexed writing operation like that described above, a storage cell can maintain its stored data value. More particularly, a voltage drop introduced by a switch path may prevent a write voltage from having a large enough magnitude to force a storage cell to switch from one state to another.

In this way, either storage cell 104-0 or 104-1 can be separately written to by a corresponding single bit line. Further, as shown in FIG. 1, a CAM cell 100 may be connected to two bit lines, unlike four bit line arrangements like that of FIG. 10.

Figure 2:
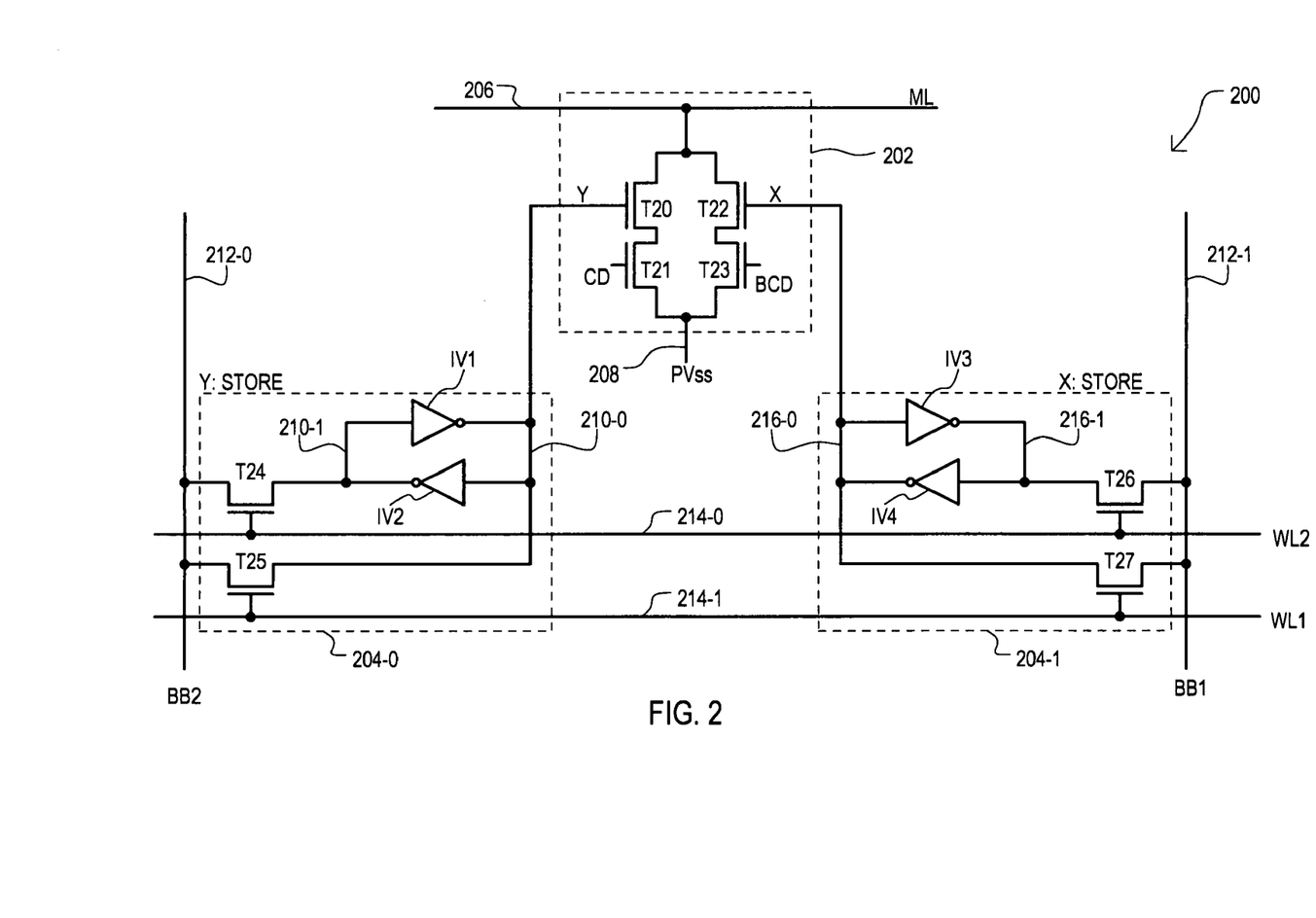
FIG. 2 is a schematic diagram of a CAM cell according to a second embodiment.

Referring now to FIG. 2, a single ended, write-multiplexed (MUXed), bit-maskable X/Y type CAM cell is shown in a detailed schematic diagram, and designated by the general reference character 200. CAM cell 200 can be capable of non-atomic parallel writes. CAM cell 200 can be considered "single ended", in that reads can be performed from one side of a CAM cell to access one of two storage cell values via a corresponding bit line. Such read operations will be described in more detail below.

An X/Y CAM cell 200 can provide ternary encoding as shown in Table I.

TABLE I

| X | Y | Value |
|---|---|---|
| 1 | 0 | 0 |
| 0 | 1 | 1 |
| 0 | 0 | 0/1 (don't care) |

Referring still to FIG. 2, a CAM cell 200 can include a compare section 202, a first storage cell 204-0, and a second storage cell 204-1. A compare section 202 can include controllable impedance paths T20 to T23. Paths T20/T21 can be arranged in series between a match line 206 and a discharge node 208. Paths T22/T23 can be arranged in series between a match line 206 and a discharge node 208. In the very particular example of FIG. 2, impedance paths T20 to T23 can be n-channel insulated gate field effect transistors (referred to herein as NFETs). In more detail, impedance path T20 can include an NFET having a drain connected to match line 206 and a gate connected to receive a first stored data value (Y). Impedance path T21 can include an NFET having a drain connected to a source of T20, a gate connected to receive a compare data value (CD), and a source connected to discharge node 208. Impedance path T22 can include an NFET having a drain connected to match line 206 and a gate connected to receive a second stored data value (X). Impedance path T23 can include an NFET having a drain connected to a source of T22, a gate connected to receive a complementary compare data value (BCD), and a source connected to discharge node 208.

In one embodiment, a discharge node 208 can be a "pseudo-Vss" (PVss) node that is initially charged to a low potential, then allowed to float in a compare operation to thereby reduce current draw when match lines discharge to associated discharge nodes.

In the example of FIG. 2, a first storage cell 204-0 can have an SRAM cell type structure, including two inverters IV1 and IV2, arranged in a cross-coupled fashion between storage nodes 210-0 and 210-1, to form one particular type of a latch. It is understood that nodes 210-0/1 can provide complementary data values (e.g., Y and YB). First storage cell 204-0 can provide a stored data value to compare section 202. In the very particular example shown, node 210-0 can be connected to a gate of NFET of T20 to provide a Y data value.

First storage cell 204-0 can also include access paths arranged between both storage nodes and the same bit line. In the example shown, storage cell 204-0 includes access path T24 arranged between node 210-1 and bit line 212-0, and access path T25 arranged between node 210-0 and bit line 212-0. FIG. 2 shows an arrangement in which path T24 can include an NFET having a source-drain path connected between node 210-1 and bit line 212-0 and a gate connected to a first word line 214-0. Path T25 can include an NFET having a source-drain path connected between node 210-0 and bit line 212-0 and a gate connected to a second word line 214-1.

A second storage cell 204-1 can have the same general structure as first storage cell 204-0, including cross-coupled inverters IV3 and IV4, and a third storage node 216-0 connected to a bit line 212-1 by an access device T27, and a fourth storage node 216-1 connected to bit line 212-1 by an access device T26. A data value stored by second storage cell 204-1 can be considered an "X" data value that is also provided to compare section 202.

Having described the general structure of a second embodiment 200, operation examples of TCAM cell 200 will now be described.

Unlike conventional approaches like those of FIGS. 9 and 10, write operations to a memory cell 200 can be "single-ended" and multiplexed (MUXed). That is, in a write operation, a bit line can be driven to a write data value and then connected to a storage cell. Subsequently, the same bit line can be driven to a complementary write data value and connected to the same memory cell. In the particular example of FIG. 2, in a write operation to storage cell 204-0, bit line 212-0 can be driven to a first write data value (e.g., high or low) and a first word line 214-0 can be activated to connect such a write data value to storage node 210-1. First word line 214-0 can then be deactivated. Bit line 212-0 can then be driven to the complementary write data value (e.g., low or high), and a second word line 214-1 can be activated to connect the complementary write data to storage node 210-0. Second word line 214-1 can then be deactivated.

Write operations to storage cell 204-1 can be performed in the same general fashion, but with data being driven on bit line 212-1.

It is understood that MUXed write operations, like those described above, can be executed on storage cells separately (i.e., non-atomic) or simultaneously (i.e., atomic). In the case of non-atomic write operations, while complementary write data values are driven on one bit line, the other bit line can be maintained at a predetermined potential that prevents a write from taking place. As but one example, such a bit line can be maintained at a high potential, and a threshold voltage drop of an access device can prevent a corresponding cell from flipping states. In addition or alternatively, a bit line may be maintained at some intermediate value that will not cause a memory cell to flip states.

Still further in CAM devices operating according to an internal periodic timing signal, MUXing of a write data value can be timed according to corresponding half cycles of such a signal. That is, in a first half-cycle a bit line can be driven to a first write data value and one word line activated. In the next half-cycle the bit line can be driven to a complementary write data value and the other word line activated.

Referring still to FIG. 2, in a compare operation, compare data values CD and BCD can be forced low to thereby isolate match line 206 from discharge node 208. Subsequently, match line 206 can be forced high, while discharge node 208 can be forced low. Compare data values (CD and BCD) can then be driven to complementary values according to an applied comparand bit value. In the event of a match result (HIT) or mask result (cell has "don't care" state), compare section 202 can maintain a high impedance state, and match line 206 can remain precharged. Conversely, in the event of a no match result (MISS) compare section 202 can provide a low impedance state, and match line 206 can discharge to discharge node 208.

Read operations for a CAM cell 200 can vary according to access circuitry and/or sense amplifier configuration. In particular, a read operation can be a MUXed or not-MUXed (single access). Single access read operations can include activating a single word line (214-0 or 214-1) to place stored data values onto bit lines 212-0 and 212-1.

A MUXed read operation for a CAM cell 200 will now be described with reference to FIGS. 3 and 4. In a MUXed read operation, a first node of a storage cell can be connected to a bit line, and the corresponding charge/potential coupled to a first input of a differential sense amplifier. Subsequently, a second node of the same storage cell can be connected to the same bit line, and the corresponding charge/potential coupled to a second input of a differential sense amplifier. The resulting differential potential generated at the inputs of the sense amplifier can then be amplified.

Figure 3:
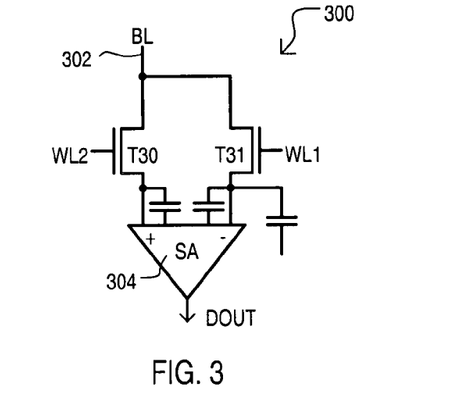
FIG. 3 is a block schematic diagram of a sense amplifier configuration according to an embodiment.

FIG. 3 shows one particular sense amplifier (SA) configuration 300 for a MUXed read operation. SA configuration 300 can receive a bit line 302, and include sense access devices T30, T31 and a differential amplifier 304. A bit line 302 can be a bit line connected to a CAM cell, such as that shown in FIG. 2. Access device T31 can connect bit line 302 to a first input "−" (inverting input) according to a word line signal WL1. Word line signal WL1 can be the same as, or activated concurrently with, a signal used to activate a first word line connected to the CAM cell from which data is being read. Access device T32 can connect bit line 302 to a second input "+" (non-inverting input) according to a word line signal WL2, that can be the same as, or activated concurrently with, a signal used to activate a second word line connected to a CAM cell from which data is being read. As shown in FIG. 3, each differential amplifier 304 can have an input capacitance associated with it that can hold a data value read from a CAM cell. Such an input capacitance can be inherent in the circuit structure (e.g., transistor gates, parasitic capacitance, etc.) and/or intentionally introduced (e.g., capacitor structure, or oversized gate, etc.). In the particular example of FIG. 3, access devices T30 and T31 can include NFETs.

Figure 4:
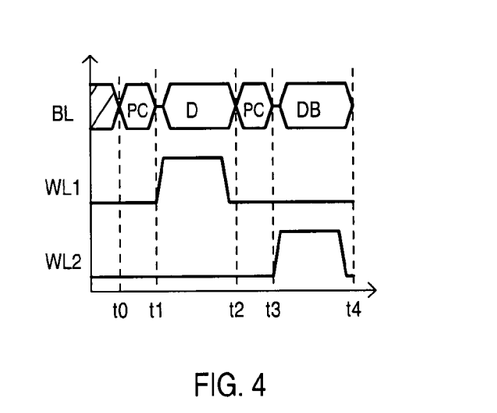
FIG. 4 is a timing diagram showing the operation of the sense amplifier configuration of FIG. 3.

A MUXed read operation for a configuration like that of FIG. 3 is shown in a timing diagram of FIG. 4. Referring now to FIG. 4 in conjunction with FIG. 3, at a time t0, a bit line can be precharged (indicated by symbol "PC"). Such an operation can condition a bit line to detect a read data value. In particular example, a bit line can be precharged to a high potential or low potential. Alternatively, a bit line can be precharged to an intermediate potential between a high and low voltage.

At time t1, a bit line precharge operation can end. Subsequently, signal WL1 can be activated. As a result, a read data value (D) can be placed on bit line 302 by connecting a storage cell to the bit line. In particular, access device T30 can be activated and provide a low impedance path between bit line 302 and a (−) input of amplifier 304. Prior to time t2, a signal WL1 can return low and access device T31 can present a high impedance.

At a time t2, bit line 302 can once again be precharged.

At time t3, a bit line precharge operation can end, and signal WL2 can now be activated. As a result, a complementary read data value (DB) can be placed on bit line 302 by connecting a complementary node within a storage cell to the bit line. In the particular example shown, access device T31 can be activated and provide a low impedance path between bit line 302 and a (+) input of amplifier 304.

Amplifier 304 can then amplify a resulting differential voltage present between inputs (−) and (+).

In this way, complementary nodes of a storage cell can be accessed in a MUXed fashion to generate a differential voltage representative of the read stored data value.

As in the case of a MUX write operation, in CAM devices operating according to an internal periodic timing signal, MUXing of a read data value can be timed according to corresponding half cycles of such a timing signal.

In this way, a CAM cell 200 can execute compare operations, MUXed write and/or read operations, and non-MUXed read operations.

Write operations can be atomic, by MUXing complementary write data values on both bit lines. However, write operations can also be non-atomic, by MUXing data values on only one of the bit lines. Along these same lines, writes can be bit maskable, by driving a data value along one bit line, and write MUXing data into CAM cells of different rows from the same bit line. Still further, pseudo-ternary capabilities can be met with parallel writes to multiple CAM cell rows within a CAM array. In particular, data can be driven on bit lines, while word lines for multiple rows are activated.

With respect to read operations, the above illustrates one approach by which read operations can be differential reads, reading complementary data values into differential inputs of an amplifier.

Figure 5:
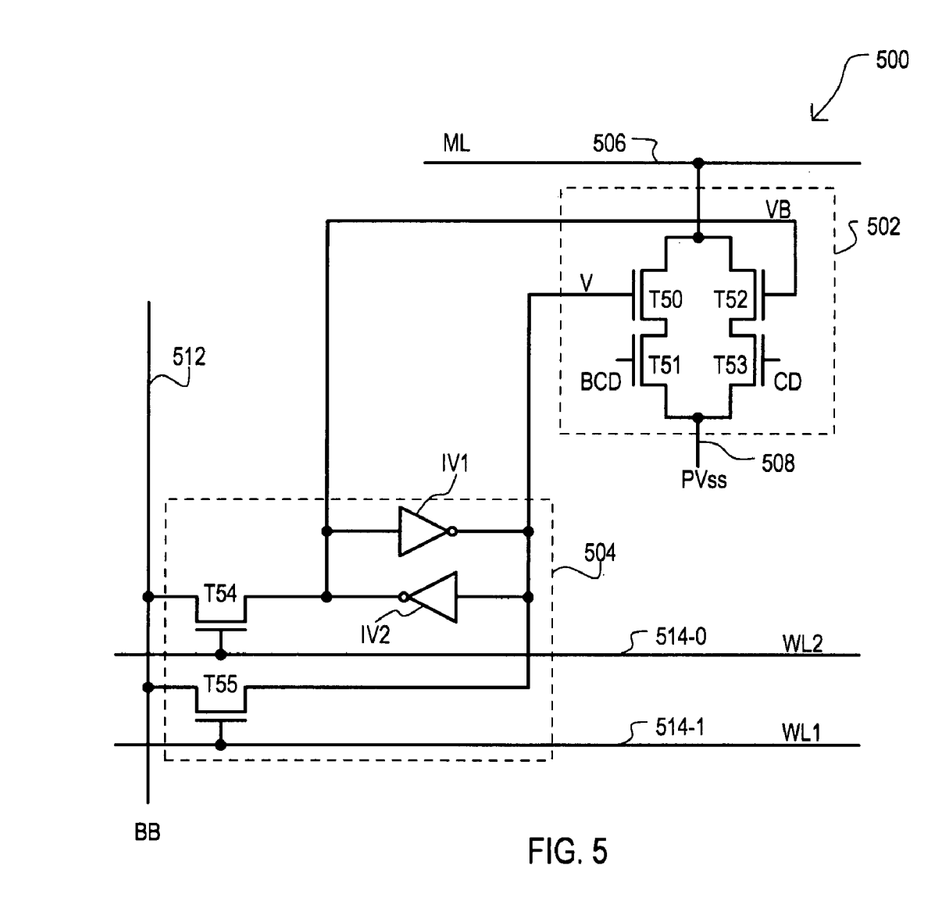
FIG. 5 is a schematic diagram of a CAM cell according to a third embodiment.

While FIG. 2 presents a TCAM cell, embodiments can also include a binary CAM cell. One example of such binary CAM cell is shown in FIG. 5, and designated by the general reference character 500. A binary CAM cell 500 can include a compare section 502 and a storage cell 504. A compare section 502 can have the same general structure as that shown in FIG. 2, and include paths T50 to T53. However, unlike FIG. 2, impedance path T50 can be controlled according to a value (V) stored in storage cell 504, while impedance path T52 can be controlled according to a complementary data value (VB) provided by storage cell 504.

A storage cell 504 can have the same general structure as storage cell 204-0 or 204-1, shown in FIG. 2.

Data can be written to storage cell 504 in the same general fashion as described above for FIG. 2. That is, write operations can be "single-ended" and multiplexed (MUXed).

Compare operations for binary CAM cell 500 can proceed in a similar fashion to that of FIG. 2. In a compare operation, compare data values CD and BCD can be forced low, isolating match line 506 from discharge node 508. Subsequently, match line 506 can be forced high, while discharge node 508 can be forced low. Compare data values (CD and BCD) can then be driven to complementary values according to an applied comparand value. In the event of a match result (HIT) (cell data matches compare data), compare section 502 can maintain a high impedance state and match line 506 can remain precharged. Conversely, in the event of a no match result (MISS) compare section 502 can provide a low impedance state, and match line 506 can discharge to discharge node 508.

Read operations for a CAM cell 500 can occur in the same general fashion as read operations for the embodiment of FIG. 2.

Figure 6:
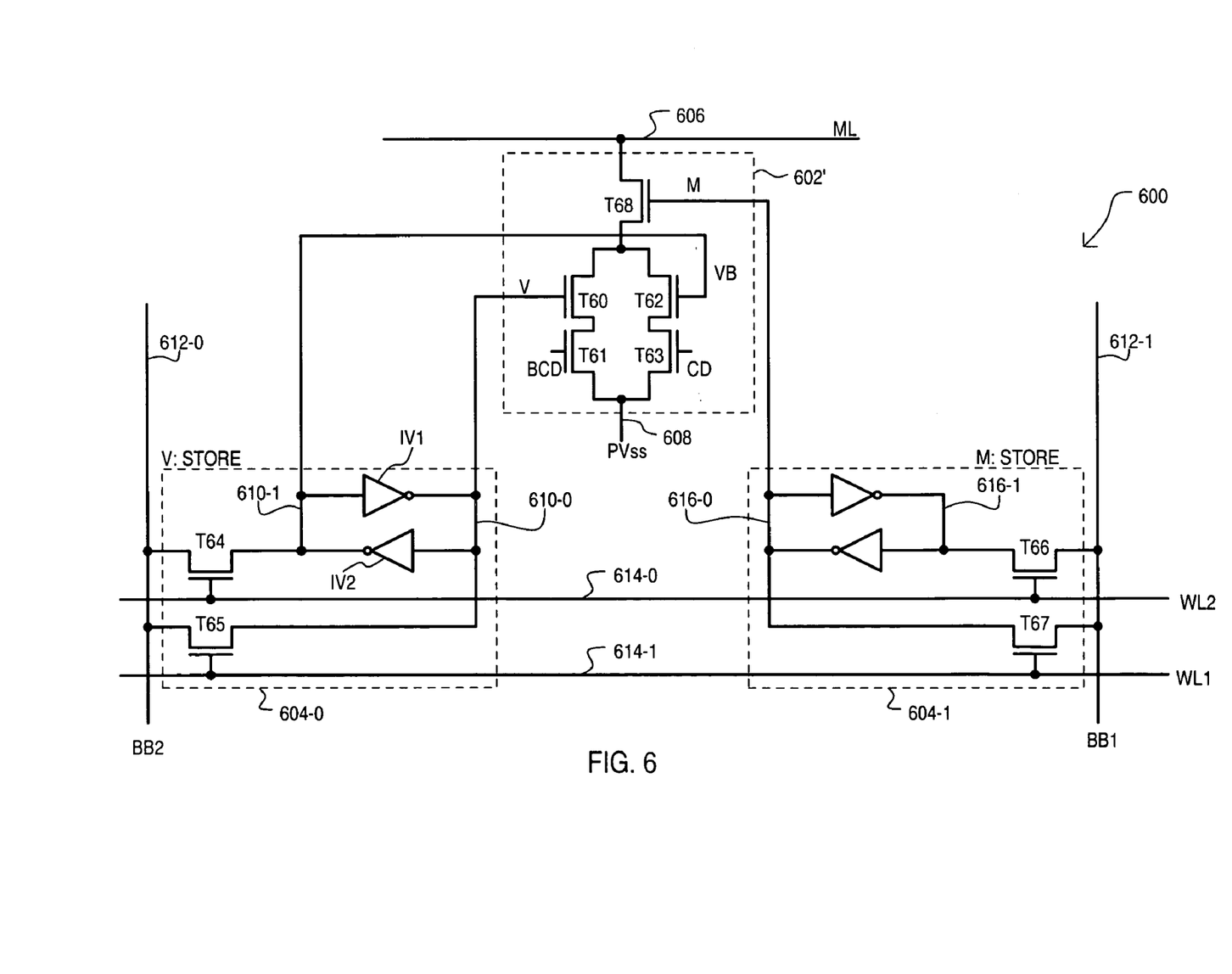
FIG. 6 is a schematic diagram of a CAM cell according to a fourth embodiment.

Of course, TCAM cells according the embodiments are not limited to X/Y type TCAM cells and can include other types of compare configurations. One variation according to another embodiment is shown in FIG. 6, and designated by the general reference character 600. A TCAM cell 600 can be a V/M type TCAM cell. Accordingly, a TCAM cell 600 can operate according to the ternary encoding shown in Table II.

TABLE II

| V | M | Value |
|---|---|---|
| 0 | 0 | 0 |
| 1 | 0 | 1 |
| 0/1 | 1 | 0/1 (don't care) |

A V/M CAM cell 600 can include some of the same general structures as FIG. 2. Accordingly, like structures are referred to by the same reference character, but with the first digit being a "6" instead of a "2".

A V/M CAM cell 600 can include a compare section 602' that differs from that of FIG. 2. In particular, within compare section 602' impedance path T60 can be controlled according to a value (V) stored in storage cell 604-0, while impedance path T62 can be controlled according to a complementary data value (VB) provided by storage cell 604-0. In addition, compare section can include mask impedance path T68 connected between match line 606 and impedance paths T60 and T62. Mask impedance path T68 can be controlled according to a mask value stored in storage cell 604-1.

Write, compare and read operations can occur in the same general fashion as described for FIG. 2. Notably, writes can be non-atomic with respect to values V and M stored in storage cells 604-0 and 604-1, respectively.

TCAM cell embodiments like those shown in FIGS. 2 and 6 can provide for single ended and/or non-atomic write capabilities and utilize but two bit lines. However, such arrangements can include two compare data lines per cell, to carry the values CD and BCD to each cell of a column. Thus, a CAM device including such CAM cells can include four conductive lines per column. Other embodiments that can provide greater reductions in vertical (i.e., column wise) conductors will now be described with reference to FIGS. 7 and 8.

Figure 7:
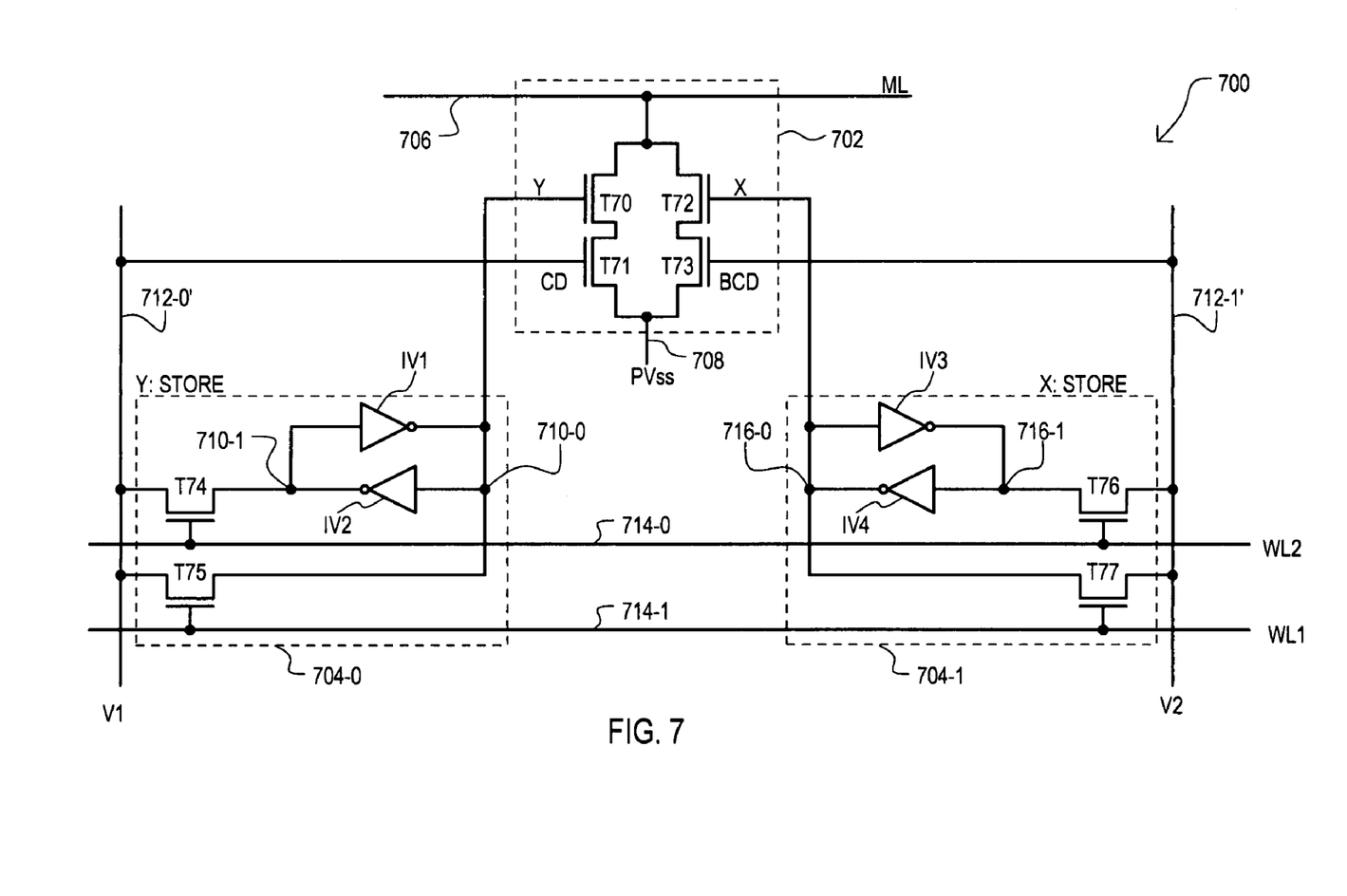
FIG. 7 is a schematic diagram of a CAM cell according to a fifth embodiment.

FIG. 7 is a schematic diagram of an X/Y type TCAM cell 700 according to another embodiment. The X/Y TCAM cell 700 can include some of the same general structures as FIG.

2. Accordingly, like structures are referred to by the same reference character, but with the first digit being a "7" instead of a "2".

TCAM cell 700 can differ from that of FIG. 2 in that conductive lines 712-0' and 712-1' can be value lines that serve as both bit lines and compare data lines. More particularly, in a write and read operations, conductive lines (712-0' and 712-1') can carry write data and read data, respectively. However, in a compare operation, conductive lines (712-0' and 712-1') can carry compare data signals CD and BCD.

Write, compare and read operations can otherwise occur in the same general fashion as described for FIG. 2.

In this way, a TCAM cell 700 can provide for single-ended non-atomic writes, but at the same time, can include two conductive lines per column rather than four.

It is understood that other embodiments can include incorporating the line arrangement of FIG. 7 into a V/M type CAM cell like that of FIG. 6. In addition, in a binary CAM arrangement, a bit line (e.g., 512) can be utilized to provide a compare data signal (e.g., CD or BCD) to a compare stack (e.g., 502).

Figure 8:
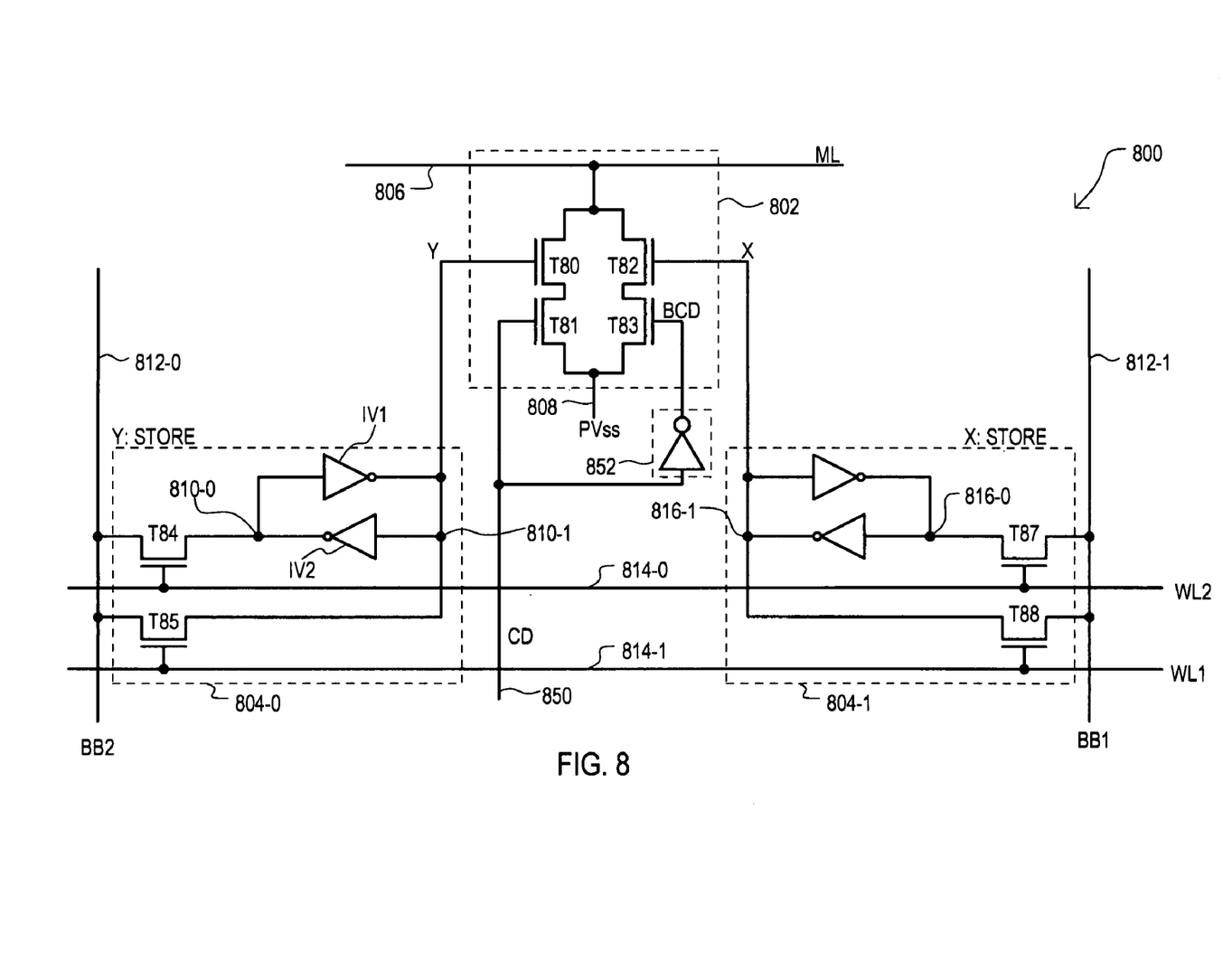
FIG. 8 is a schematic diagram of a CAM device according to a sixth embodiment.

Referring now to FIG. 8, an X/Y type TCAM cell 800 according to another embodiment is shown in a schematic diagram. The X/Y TCAM cell 800 can include some of the same general structures as FIG. 2. Accordingly, like structures are referred to by the same reference character, but with the first digit being an "8" instead of a "2".

TCAM cell 800 can differ from that of FIG. 2 in that compare data can be provided to a compare stack 802 by a single line 850. A compare data value CD can be driven on line 850 and can control impedance path T81 within compare section 802. Signal CD can be inverted by logic 852 to generate complementary compare data value BCD that can control impedance path T83.

In the particular example of FIG. 8, logic 852 can be an inverter. In such a case, timing and/or structures for the precharging of a match line 806 and/or discharge node 808 can be different, as one of the conductive legs (i.e., either T80/T81 or T82/T83) can be enabled during precharge operations. For example, a discharge node 808 can isolated until compare data is settled, and then connected to a discharge potential.

Write and read operations can occur in the same general fashion as described for FIG. 2.

In this way, a TCAM cell 800 can provide for single-ended non-atomic writes, but at the same time include three conductive lines per column.

As in the case of FIG. 7, it is understood that another other embodiments can include incorporating the compare data line/logic arrangement of FIG. 8 into a V/M type CAM cell like that of FIG. 6. Further, such an arrangement can also be incorporated into a binary CAM cell, like that of FIG. 5.

The above embodiments can provide CAM cells that can allow for (i) atomic writes to X/Y and V/M CAM cells; (ii) independent non-atomic writes to different storage cells of a ternary CAM cell; (iii) bit maskable writes; (iv) independent, parallel writes to multiple rows of CAM cells within a CAM array; (v) reductions in the area of a CAM cell, particularly with respect to conductive lines in a column-wise direction.

It is noted that while the embodiments have illustrated particular types of compare sections, such particular circuit structures should not be construed as limiting the invention thereto. Further, while the embodiments show particular storage cell types, other embodiments can utilize different types of storage cell, including but not limited to nonvolatile memory cells, and the like.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) cell circuit, comprising:
   a match section that enables an impedance path coupled to a match line in response to a comparison between a data value and a compare data value;
   at least a first storage circuit coupled to the match section that provides the data value on a first storage node and a complementary data value on a second storage node; and
   at least a first bit line coupled to the first storage node by a first access controllable impedance path and coupled to the second storage node by a second access controllable impedance path.

2. The CAM cell circuit of claim 1, wherein:
   the match section includes
   a first match transistor having a first impedance path coupled to the match line and controlled according to a compare data value and a second match transistor having a second controllable impedance path coupled in series with the first controllable impedance that is controlled according to a data value stored in the at least one storage circuit.

3. The CAM cell circuit of claim 2, wherein:
   the CAM cell comprises a binary CAM cell; and
   the match section includes the first controllable impedance path being controlled according to a complementary data value and the second controllable impedance path being controlled according to a compare data value, and
   a third match transistor having a third impedance path coupled to the match line and controlled according to a data value and a fourth match transistor having a fourth controllable impedance path coupled in series with the third controllable impedance that is controlled according to a complementary compare data value.

4. The CAM cell circuit of claim 1, wherein:
   the CAM cell comprises an X/Y type ternary CAM cell that further includes a second storage circuit coupled to the match section that provides a second data value; and
   the match section includes the first controllable impedance path being controlled according to a first data value from the first storage circuit and the second controllable impedance path being controlled according to a compare data value, and
a third match transistor having a third impedance path coupled to the match line and controlled according to the second data value and a fourth match transistor having a fourth controllable impedance path coupled in series with the third controllable impedance that is controlled according to a complementary compare data value.

5. The CAM cell circuit of claim 1, wherein:
the CAM cell comprises a V/M type ternary CAM cell that further includes a second storage circuit coupled to the match section that provides a mask data value; and
the match section includes
the first controllable impedance path being controlled according to a complementary data value from the first storage circuit and the second controllable impedance path being controlled according to a compare data value,
a third match transistor having a third impedance path coupled to the match line and controlled according to the data value from the first storage circuit and a fourth match transistor having a fourth controllable impedance path coupled in series with the third controllable impedance that is controlled according to a complementary compare data value, and
a mask transistor having a mask controllable impedance path coupled between the match line and the first transistor and third transistor that is controlled according to the mask value.

6. The CAM cell circuit of claim 1, wherein:
the at least a first bit line is further coupled to the match section and provides the compare data value thereto in a compare operation.

7. The CAM cell circuit of claim 1, wherein:
the first access controllable impedance path comprises a first access transistor having a control terminal coupled to a first word line, and the second access controllable impedance path comprises a second access transistor having a control terminal coupled to second word line.

8. The CAM cell circuit of claim 7, further including:
a second storage circuit coupled to the match section that provides a second data value on a third storage node and a complementary second data value on a fourth storage node; and
a second bit line coupled to the third storage node by a third access transistor having a control terminal coupled to the first word line, and coupled to the fourth storage node by a fourth access transistor having a control terminal coupled to the second word line.

9. The CAM cell circuit of claim 1, further including:
a single compare data line coupled to a first input of the match section and coupled to receive a compare data value; and
a logic circuit coupled between the single compare data line and a second input of the match section that generates a complementary compare data value.

10. A method of accessing a CAM cell circuit, comprising the steps of:
providing a first storage circuit that includes a first storage node and a second storage node that provide complementary data values, the first storage circuit providing at least one input to a compare circuit that compares data of the storage circuit to at least one compare data value;
enabling a first impedance path between a first bit line and the first data storage node; and
subsequently disabling the first impedance path and enabling a second impedance path between the first bit line and the second data storage node.

11. The method of claim 10, wherein:
in a write operation,
driving the first bit line to a write data value prior to enabling the first impedance path; and
driving the first bit line to a complementary write data value after disabling the first impedance path.

12. The method of claim 10, wherein:
in a write operation,
driving the first bit line to a predetermined potential prior to enabling the first impedance path; and
driving the first bit line to a write data value after disabling the first impedance path.

13. The CAM cell of claim 10, wherein:
in a differential read operation,
enabling a path between the first bit line and a first input of a differential sense amplifier when the first impedance path is enabled, and
enabling a path between the first bit line and a second input of the differential sense amplifier when the second impedance path is enabled.

14. A content addressable memory (CAM), comprising:
a plurality of CAM cells arranged into rows and columns, each CAM cell of the same column being coupled to at least a first bit line and each CAM cell of the same column being coupled to at least a first word line and a second word line; wherein
each CAM cell comprises
a first access transistor coupled between a first storage circuit and the first bit line that is enabled according to a first word line potential, and
a second access transistor coupled between the first storage circuit and the first bit line that is enabled according to a second word line potential.

15. The CAM of claim 14, wherein:
the first storage circuit stores a first data value at a first node and a complement of the first data value at a second node,
the first access transistor includes a first access controllable impedance path coupled between the first bit line and the first node, and
the second access transistor includes a second access controllable impedance path coupled between the first bit line and the second node.

16. The CAM of claim 14, wherein:
each CAM cell further includes
a third access transistor coupled between a second storage circuit and a second bit line that is enabled according to the first word line potential, and
a fourth access transistor coupled between the second storage circuit and the second bit line that is enabled according to a second word line potential.

17. The CAM of claim 14, wherein:
each CAM cell further includes
a compare stack section comprising a first compare transistor and second compare transistor that provide a first charge transfer path between a match line and a compare node, the first compare transistor having a control terminal coupled to the first storage circuit and the second compare transistor having a control terminal coupled to a compare data value.

18. The CAM of claim 17, wherein:
each CAM cell further includes
the compare stack section having a third compare transistor and fourth compare transistor that provide a second charge transfer path between the match line and the compare node, the third compare transistor having a control terminal coupled to the first storage circuit and the fourth compare transistor having a control terminal coupled to a complementary compare data value.

19. The CAM of claim 18, wherein:

each CAM cell further includes the compare stack section having a mask transistor coupled between the match line and the first and third compare transistors, the mask transistor having a control terminal coupled a second storage circuit the CAM cell.

20. The CAM of claim 17, wherein:

each CAM cell further includes the compare stack section having a third compare transistor and fourth compare transistor that provide a second charge transfer path between the match line and the compare node, the third compare transistor having a control terminal coupled to a second storage circuit of the CAM cell and the fourth compare transistor having a control terminal coupled to a complementary compare data value.

* * * * *